(12) United States Patent
Kido

(10) Patent No.: US 6,670,104 B2
(45) Date of Patent: Dec. 30, 2003

(54) PATTERN FORMING METHOD AND METHOD OF MANUFACTURING THIN FILM TRANSISTOR

(75) Inventor: Shusaku Kido, Tokyo (JP)

(73) Assignee: NEC LCD Technologies, Ltd., Kanagawa (JP)

(*) Notice: Subject to any disclaimer, the term of this patent is extended or adjusted under 35 U.S.C. 154(b) by 337 days.

(21) Appl. No.: 09/892,559

(22) Filed: Jun. 28, 2001

(65) Prior Publication Data
US 2002/0001777 A1 Jan. 3, 2002

(30) Foreign Application Priority Data
Jul. 3, 2000 (JP) .................................. 2000-201175

(51) Int. Cl.[7] .................................................. G03C 5/00
(52) U.S. Cl. ...................... 430/314; 430/316; 430/317; 430/318; 430/323; 430/324
(58) Field of Search ................. 430/312, 313, 430/314, 316, 317, 318, 322, 324, 323, 325

(56) References Cited

U.S. PATENT DOCUMENTS 6,312,874 B1 * 11/2001 Chan et al. .................. 430/314
6,465,157 B1 * 10/2002 Li et al. ...................... 430/313
6,495,469 B1 * 12/2002 Yang et al. .................. 438/725

FOREIGN PATENT DOCUMENTS

JP 7-240535 9/1995
JP 11-307780 11/1999

* cited by examiner

Primary Examiner—Mark F. Huff
Assistant Examiner—Saleha Mohamedulla
(74) Attorney, Agent, or Firm—Young & Thompson

(57) ABSTRACT

After films composing a TFT are laminated on an insulating substrate, a resist mask having a plurality of regions with different film thicknesses is formed by patterning on the uppermost layer of the above-stated films. Then, a conductor film is formed by patterning with a liftoff method using this resist mask. Alternatively, using other resist mask having a plurality of regions with different film thicknesses as an etching mask, a plurality of material films among the laminated material films are processed in succession. By the above-stated new pattern forming method and the processing method, the liquid crystal display device, which has been manufactured by five photolitho processes in a conventional art is manufactured by two or three photolitho processes.

11 Claims, 15 Drawing Sheets

(a)

(b)

(c)

(d)

(e)

(a)

(b)

PATTERN FORMING METHOD AND METHOD OF MANUFACTURING THIN FILM TRANSISTOR

BACKGROUND OF THE INVENTION

1. Field of the Invention

The present invention relates to a pattern forming method, and more particularly to a method of manufacturing a thin film transistor (TFT) used in a liquid crystal display device and a method of forming a pattern thereof.

2. Description of the Related Art

In an active matrix substrate for a liquid crystal display device, inverted staggered type TFTs are generally used. In manufacturing of this active matrix substrate for a liquid crystal display device, it is currently necessary to perform a photolithography process five times (hereinafter referred to as photolitho process).

In this active matrix substrate for a liquid crystal display device (for example, TFT structure), the number of manufacturing processes is less than that in a semiconductor integrated circuit. However, in the conventional technique used in manufacturing the active matrix substrate for a liquid crystal display device, it is necessary to perform the photolitho process at least five times. This has been a factor for increasing the manufacturing cost. Thus, it is essential to reduce the number of photolitho processes for manufacturing the active matrix substrate for a liquid crystal display device.

In order to reduce this manufacturing processes, it is effective to reduce the number of photolitho processes. The present inventor has studied about the reduction of the number of photolitho processes and the simplification of the photolitho process for many years. For example, in Japanese Patent Application Laid-open No. Hei 11-307780, a method of forming a resist mask having a plurality of regions in which film thicknesses are different from each other by a specified exposure method in the photolithography technique is proposed and a technique of manufacturing a TFT using such a resist mask is disclosed.

In order to reduce the manufacturing processes, a liftoff technique using the photolitho process is known except for the above-stated reduction method of the number of the photolitho processes. This liftoff technique is often used for forming wirings of a semiconductor integrated circuit, and used for reducing the manufacturing processes in manufacturing of the thin film transistors for a liquid crystal display device. Thus, first, the formation of the wirings by this liftoff technique as a conventional technique will be described with reference to FIGS. 1(a) to 1(e) based on the prior art disclosed in Japanese Patent Application Laid-open No. Hei 7-240535.

As shown in FIG. 1(a), a lower layer electrode 202 as a gate electrode of a TFT is formed by patterning metal such as chromium on a glass substrate 201 that is a transparent insulating substrate (first photo resist (PR) process).

An insulation layer 203 as a gate insulation layer of the TFT is formed so as to cover the lower layer electrode 202, and a semiconductor film as an active layer of the TFT is formed and then patterned to form a semiconductor region (not shown) of the TFT (second PR process).

To form a source electrode and a drain electrode of the TFT, a film of metal such as chromium for covering the semiconductor region is formed and then patterned to form the source electrode and the drain electrode (not shown) (third PR process). The source electrode and the drain electrode are used as masks for partially removing a high impurity concentration semiconductor layer formed on the surface of the semiconductor region. Then, the high impurity concentration semiconductor layer located between the source electrode and the drain electrode is removed.

With this state, a first resist mask 205 having a first opening 204 is formed by a known photolithography technique (fourth PR process). Then, using the first resist mask 205 as an etching mask, a contact hole 206 reaching the surface of the lower layer electrode 202 is formed in the insulation layer 203.

As shown in FIG. 1(b), using a photomask 209 having a light shielding portion 207 and a light transmitting portion 208 as a mask, the first resist mask 205 is again exposed with exposure irradiation light 210. After this exposure, the above-stated resist film is developed by a general method.

Thus, as shown in FIG. 1(c), a second resist mask 212 having a second opening 211 with a larger opening size than that of the above-stated contact hole 206 is formed (fifth PR process).

A metal film 213 is deposited on the entire surface by a sputtering method. Thus, as shown in FIG. 1(d), the metal film 213 which directly covers the exposed surface of the insulation layer 203, the second resist mask 212 and the lower layer electrode 202 is formed.

Then, the second resist mask 212 is removed by a general liftoff technique. In the removal process of this second resist mask 212, the portion of the metal film 213 directly covering the second resist mask 212 is simultaneously removed to pattern the metal film 213.

Thus, as shown in FIG. 1(e), an upper layer electrode 214 connecting the lower layer electrode 202 through the contact hole 206 provided in the insulation layer 203 is formed.

As described above, in the conventional technique for forming wirings of two layers which are connected with each other, even if this manufacturing method is based on the liftoff technique or an etching technique, it is necessary to perform the photolitho process at least five times for forming the lower layer electrode at first and the upper layer electrode at the end.

Also, the above-stated conventional technique is to reduce the photolitho processes that utilize the liftoff technique. However, according to the conventional technique, in an etching, for example, dry etching of the insulation layer 203, the first resist mask 205 is irradiated with light or ions, so that its surface is altered. Even if a pattern transfer to the first resist mask 205 thus altered is intended with the exposure irradiation light 210 described in FIG. 1(b), since the light is scattered by the altered film surface, the exposure to the first resist mask 205 itself is not carried out. Thus, this method cannot be applied to the case where electrodes or wirings are formed to manufacture the active matrix substrate.

As described above, in the conventional technique, it is necessary to perform the photolitho process at least five times. This has been a factor for increasing the manufacturing cost. Thus, it is essential to reduce the number of photolitho processes for manufacturing the active matrix substrate for a liquid crystal display device, and technical developments are strongly desired.

Such a reduction of the number of photolitho processes necessarily will produce the increase of a manufacturing yield of a liquid crystal display device and the improvement of the productivity thereof, and further the reliability thereof.

SUMMARY OF THE INVENTION

An object of the present invention is to provide a new pattern forming method in which the number of photolitho processes can be simply reduced.

Another object of the present invention is to provide a new method of manufacturing a TFT in which a manufacturing process of a liquid crystal display device can be greatly reduced.

In carrying out our invention in one preferred mode, we utilize a liftoff technique realized by a mask layer having different film thicknesses such that a first region, a second region thicker than the first region and a opening within the first region are formed in the mask layer. The mask layer is formed on a second layer that has a first layer thereunder, and then the second layer is etched to form a opening, which reaches a surface of the first layer, in the second layer using the mask layer as an etching mask. After the opening is formed, the first region of the mask layer is removed by etching the mask layer making the first region of the mask layer left as a third region at the same time. To form a third layer pattern connected with the first layer, a third layer is deposited on a whole second layer including the opening of the second layer and then the third region is removed followed by a removal of the third layer covering a surface of the third region, thereby forming the third layer pattern. Also, when the above pattern forming method of the present invention is applied to a method of manufacturing a thin film transistor, the thin film transistor is preferably manufactured as follows.

In a manufacturing process for the film transistor, we utilize at least two kinds of resist masks, a first resist mask having different film thicknesses such that a thin film portion and a thick film portion thicker than the thin film portion are formed in the first resist mask, a second resist mask having different film thicknesses such that a thin film portion, a thick film portion thicker than the thin film portion and a opening within the thin film portion are formed in the second resist mask.

The first resist mask is formed on a second conductive film, which is deposited on a first insulation layer that has a first conductive film pattern thereunder, and then the second conductive film is etched in its whole film thickness using the first resist mask as an etching mask to form a second conductive film pattern on the first insulation layer. After the second conductive film pattern is formed, the thin film portion of the first resist mask is removed by etching the first resist mask making the thick film portion of the first resist mask left as "a first thick film left portion" at the same time. To form a etched pattern in the second conductive film pattern, a part of the second conductive film pattern is etched from its surface using the first thick film left portion as an etching mask and then the first thick film left portion is removed.

After the etched pattern is formed in the second conductive film pattern, a second insulation layer is deposited on the second conductive film pattern covering a surface of the first insulation layer. After that, the second resist mask is formed on the second insulation layer, and then the second insulation layer is etched to form a opening, which reaches a surface of the second conductive film pattern, in the second insulation layer using the second resist mask as an etching mask. After the opening is formed in the second insulation layer, the thin film portion of the second resist mask is removed by etching the second resist mask making the thick film portion of the second resist mask left as "a second thick film left portion" at the same time. To form a third conductive film pattern connected with the second conductive film pattern, a third conductive film is deposited on a whole second insulation layer including the opening of the second insulation layer and then the second thick film left portion is removed followed by the removal of the third conductive film covering a surface of the second thick film left portion, thereby forming the third conductive film pattern.

Furthermore, in the above-mentioned method of manufacturing a thin film of the present invention, the first conductive film is a conductive film for a gate electrode, the first insulation layer is a gate insulation layer, the second conductive film is a laminated film in which a semiconductor thin film, a semiconductor thin film for an ohmic contact, and a conductive film for a source and a drain are deposited in succession, the second insulation layer is a passivation film, and the third conductive film is a metal film for source and drain lead wirings.

DETAILED DESCRIPTION OF THE PREFERRED EMBODIMENTS

A new pattern forming method of the present invention will be described as a first embodiment based on FIGS. 2(a) to 2(d).

Figure 1:
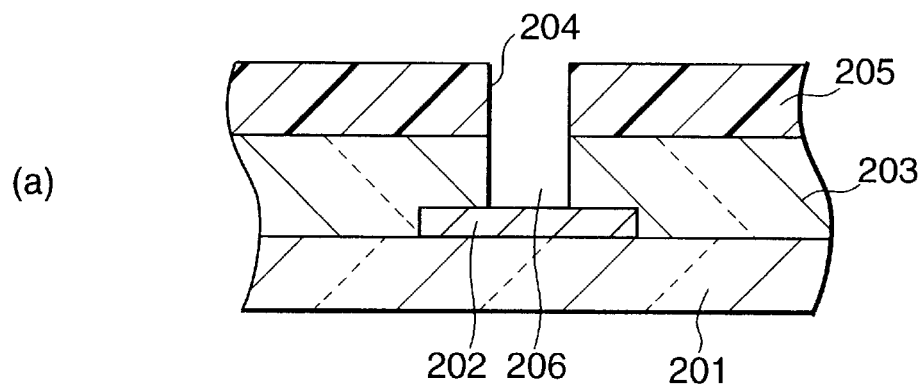
FIGS. 1(a) to 1(e) are cross sectional views of a manufacturing process in order of two-layer electrodes for explaining a conventional technique.
Figure 1:
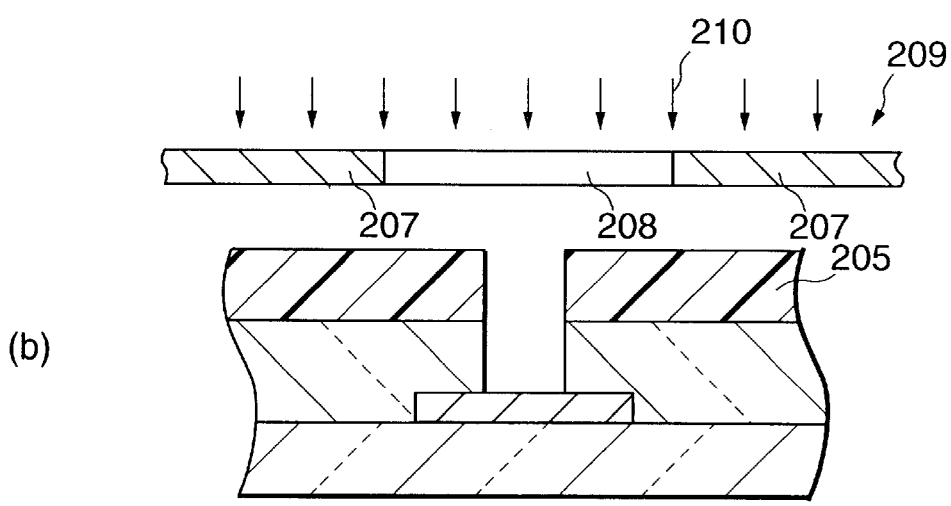
Figure 1:
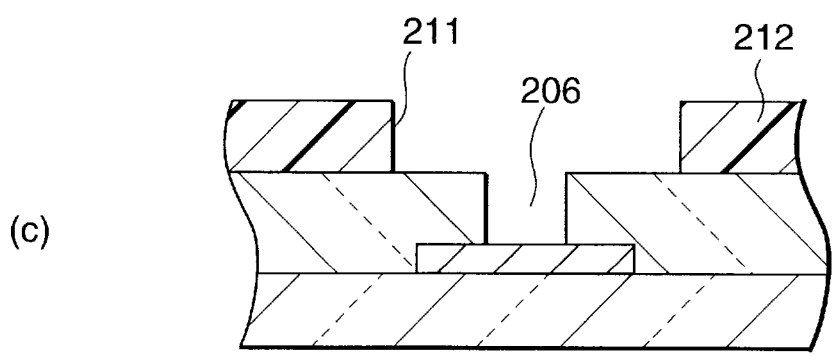
Figure 1:
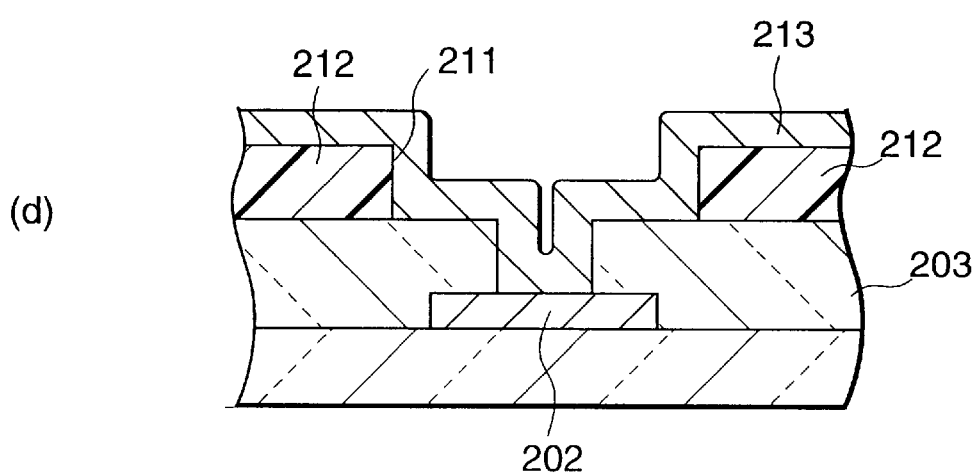
Figure 1:
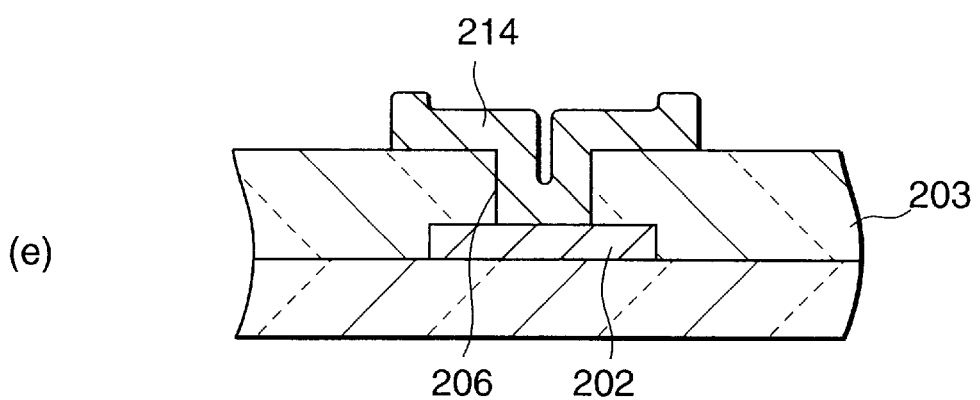
Figure 2:
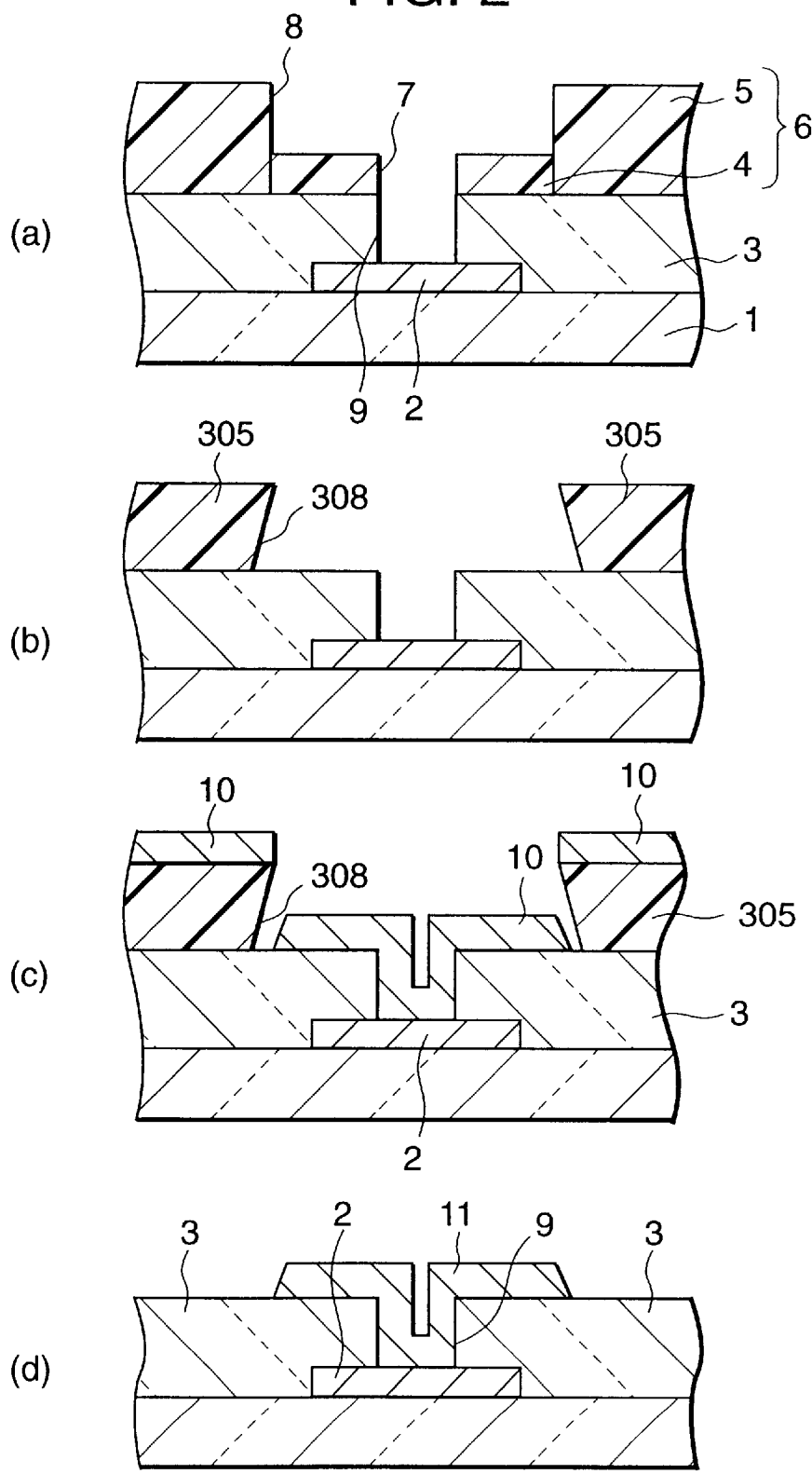
FIGS. 2(a) to 2(d) are cross sectional views of a manufacturing process in order of two-layer electrodes for explaining a first embodiment of the present invention.

As shown in FIG. 2(a), as described in the prior art, a lower layer electrode 2 as a gate electrode of a TFT is formed by patterning metal such as chromium on a glass substrate 1. Then, an insulation layer 3 for covering the lower layer electrode 2 is formed.

Next, a resist mask 6 composed of a first portion 4 as a thin region in which a film thickness is thin and a second portion 5 as a thick region in which a film thickness is thicker than the thin region is formed. Such a resist mask 6 is obtained by a method of coating a resist on the insulation layer 3, exposing the resist using a mask having three regions of a light shielding portion, a light half-transmitting portion, and a light transmitting portion with different transmittances, and developing it. Note that this method is also described in detail in Japanese Patent Application Laid-open No. Hei 11-307780.

Instead of this method, the following method can also be used. That is, first, a low photosensitive resist film in which the sensitivity to light is low is coated on the insulation layer 3. Subsequently, a high photosensitive resist film in which the sensitivity is high is coated on the low photosensitive resist film to be thicker than the low sensitive resist film. Then, these resist films are exposed using the mask having three regions of a light shielding portion, a light half-transmitting portion, and a light transmitting portion with different transmittances, and developed. Thus, the first portion 4 as a region in which the film thickness is thin (region corresponding to the light half-transmitting portion) and the second portion 5 as a region in which the film thickness is thick (region corresponding to the light shielding portion) are formed.

Here, the film thickness of the first portion 4 is about 0.5 $\mu$m and the film thickness of the second portion 5 is about 2.5 $\mu$m. A first opening 7 and a second opening 8 are formed corresponding to the light transmitting portion formed in the light half-transmitting portion of the mask and the light half-transmitting portion of the mask, respectively. Such a resist mask is formed by one photolitho process.

Next, using the above resist mask 6 as an etching mask, the insulation layer 3 is dry-etched by a reactive ion etching (RIE). Thus, a contact hole 9 reaching the surface of the lower layer electrode 2 is formed. In the above dry etching process, the surface of the resist mask 6 is irradiated with ions in plasma to be cured and modified in quality.

Next, a mixture gas of $O_2$ and $CF_4$ is plasma-excited to form those ions or radicals, that is, active species, and then an etchback in a dry etching is made for the above resist mask 6. By this etchback, only the first portion 4 of the resist mask 6 is removed. In this dry etching, the second portion 5 of the resist mask 6 is also etched to produce a side etching. Thus, a second portion 305 of the resist mask 6, which has a second opening 308 with an inverse taper shape as shown in FIG. 2(b), is left. Here, the film thickness of the left second portion 305 becomes about 1.5 $\mu$m.

Next, as described in the prior art, a metal film 10 having a film thickness of about 0.8 $\mu$m is deposited on the entire surface by a progressive sputtering method. Thus, as shown in FIG. 2(c), the metal film 10 which covers directly the surface of the insulation layer 3 and the surface of the second portion 305 and connects the lower layer electrode 2 is formed around the second opening 308. In this sputtering process, as the second opening 308 is formed into the inverse taper shape as described above, the adhesion of the metal film 10 to side walls of the second opening 308 is suppressed.

Next, the second portion 305 of the resist mask 6 is removed by a general liftoff technique. In the removal process of this second portion 305, the metal film 10 covering directly the above second portion 305 is simultaneously removed to pattern the metal film 10.

Thus, as shown in FIG. 2(d), an upper layer electrode 11 connecting the lower layer electrode 2 through the contact hole 9 provided in the insulation layer 3, is formed.

According to the present invention, as is evident from the above descriptions, the lower layer electrode, the contact hole, and the upper layer electrode can be formed by two photolitho processes. That is, the number of photolitho processes is reduced.

Also, according to the present invention, as described above, the second opening 308 with the inverse taper shape can be easily formed in the second portion 305 of the resist mask 6. Thus, the patterning of the upper layer electrode by the liftoff technique is made very much easier than that by the conventional technique. Furthermore, the reliability of the upper layer electrode is greatly improved, and thus the manufacturing yield and the productivity are greatly improved.

Next, a manufacturing method according to a modified example of the first embodiment of the present invention will be described with reference to FIGS. 3(a) to 3(f). This modified example is characterized in that, a material film except a resist is located between the resist mask 6 and the insulation layer 3 in the first embodiment, and thus the structure is such that no gases are generated even in the case where the metal film 10 is formed at a high temperature.

Figure 3:
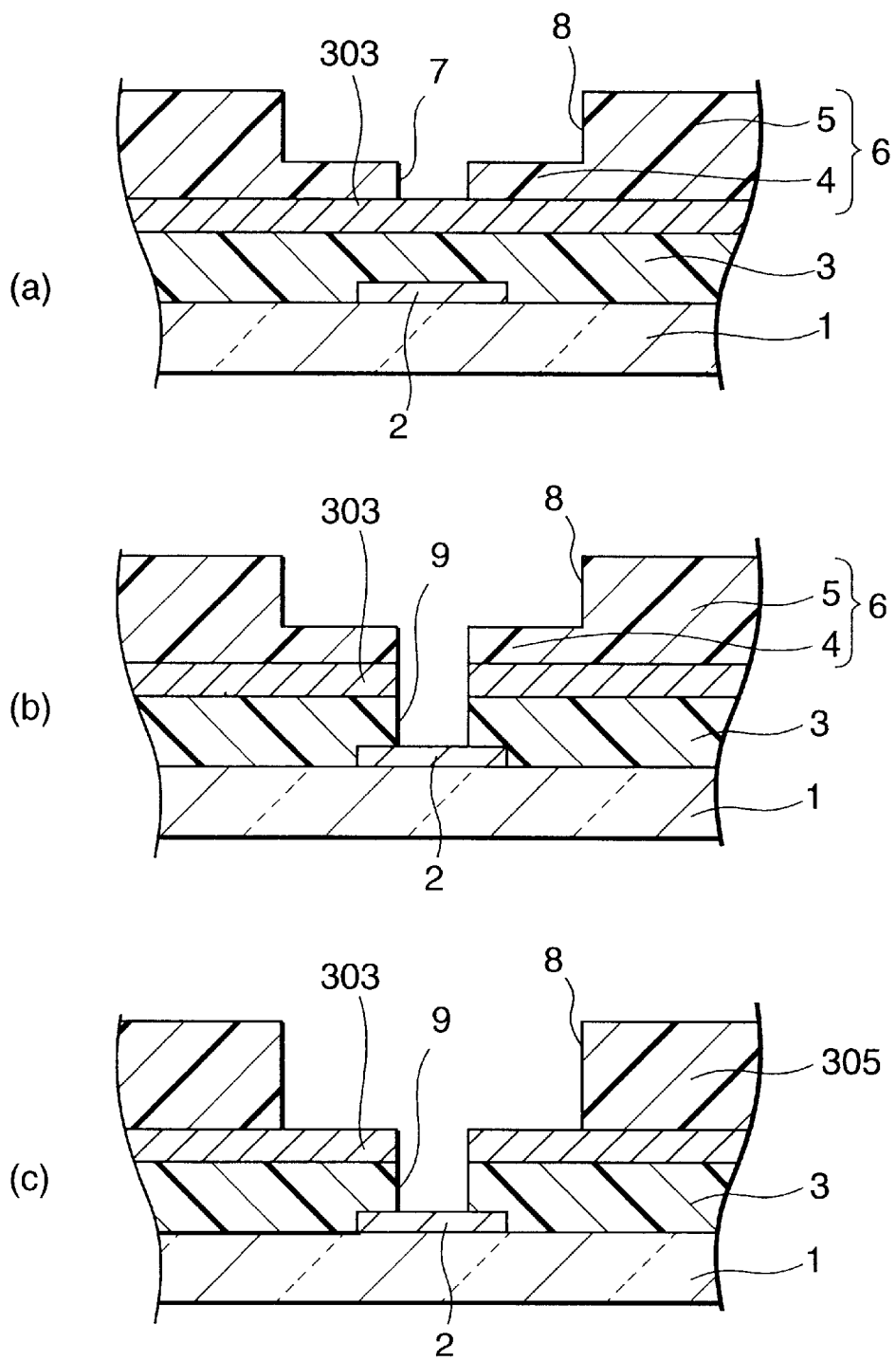
FIGS. 3(a) to 3(f) are cross sectional views of a manufacturing process in order of a TFT for explaining a modified example of the first embodiment of the present invention.
Figure 3:
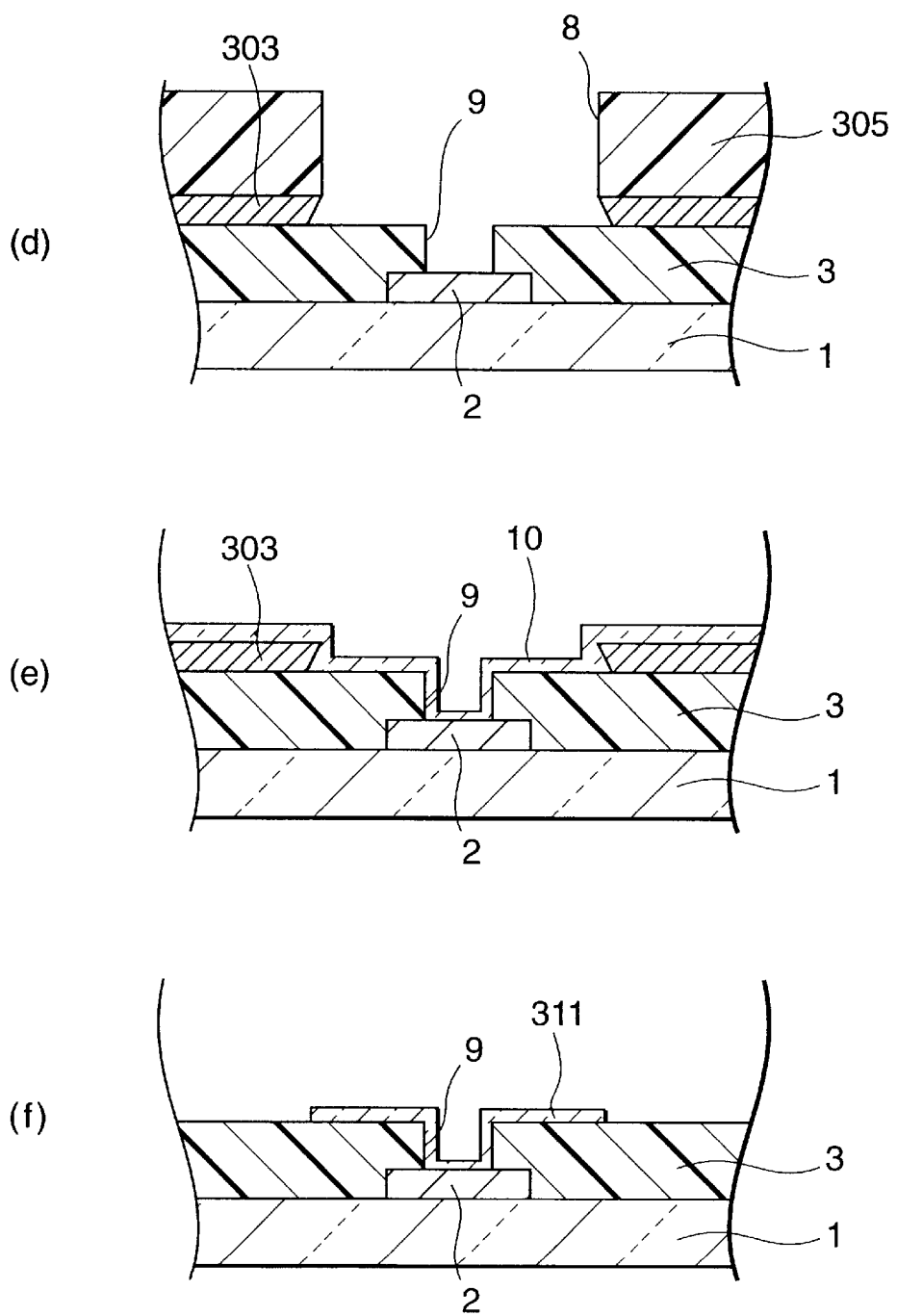

That is, concretely, as shown in FIG. 3(a), before the formation of the resist mask 6, a semiconductor film (for example, amorphous silicon or polysilicon) 303 having a thickness of 0.2 to 0.5 $\mu$m is grown on the insulation layer 3. The resist mask 6 made from a resist having the first portion 4 with a film thickness of about 0.5 $\mu$m and the second portion 5 with a film thickness of about 2.5 $\mu$m is formed thereon.

Next, as shown in FIG. 3(b), using the resist mask 6 as a mask, the semiconductor film 303 and the insulation layer 3 laminated on the lower layer electrode 2 are removed by etching to form the contact hole 9 in the insulation layer 3.

Next, as in the first embodiment, as shown in FIG. 3(c), an etchback in a dry etching is made for the resist mask 6 to remove only the first portion 4 of the resist mask 6. Thus, the surface of the semiconductor film 303 located thereunder is exposed.

Subsequently, as shown in FIG. 3(d), an exposed portion of the semiconductor film 303 is selectively removed by etching. Then, the semiconductor film 303 is patterned such that end portions of the semiconductor film 303 formed by etching have an inverse taper shape.

Thereafter, as shown in FIG. 3(e), the left second portion 305 is removed, and then an ITO film 10 having a film thickness of 50 nm is deposited on the resultant surface.

Finally, as shown in FIG. 3(f), when the semiconductor film 303 is selectively removed, the ITO film 10 covering the semiconductor film 303 is also removed to form an upper layer electrode 311.

According to this modified example, since a base of the metal film for liftoff is the semiconductor film having a resistance against a high temperature, a base structure suitable for the metal film for liftoff formed at a high temperature can be provided.

Figure 4:
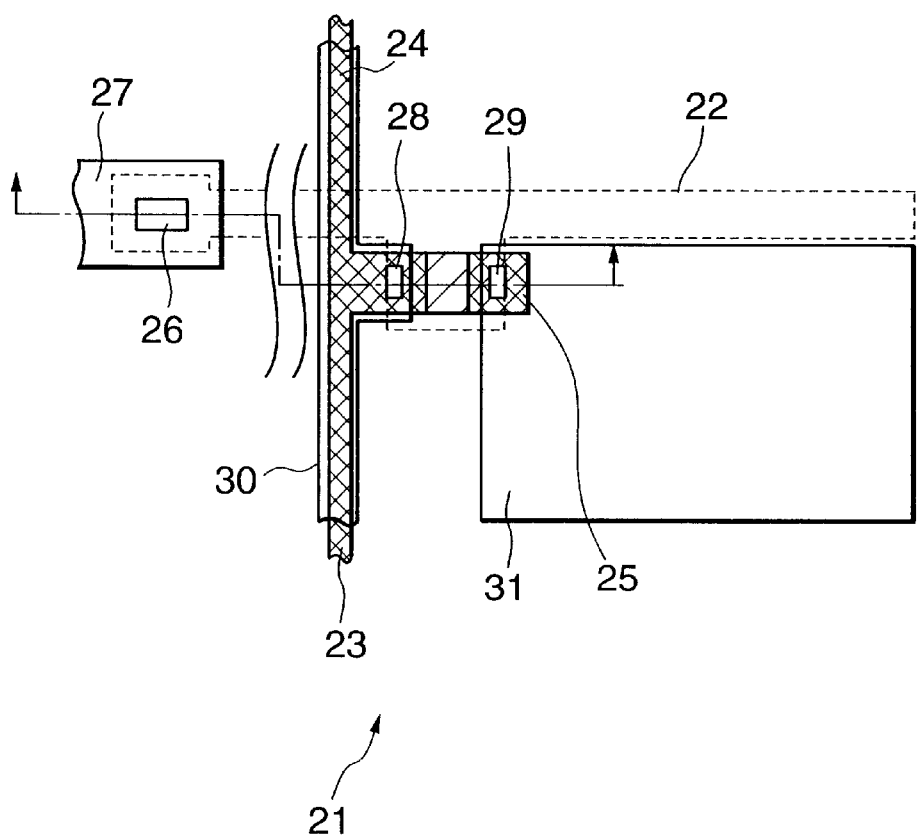
FIG. 4 is a plan view of a pixel portion of a liquid crystal display device for explaining a second embodiment of the present invention.
Figure 5:
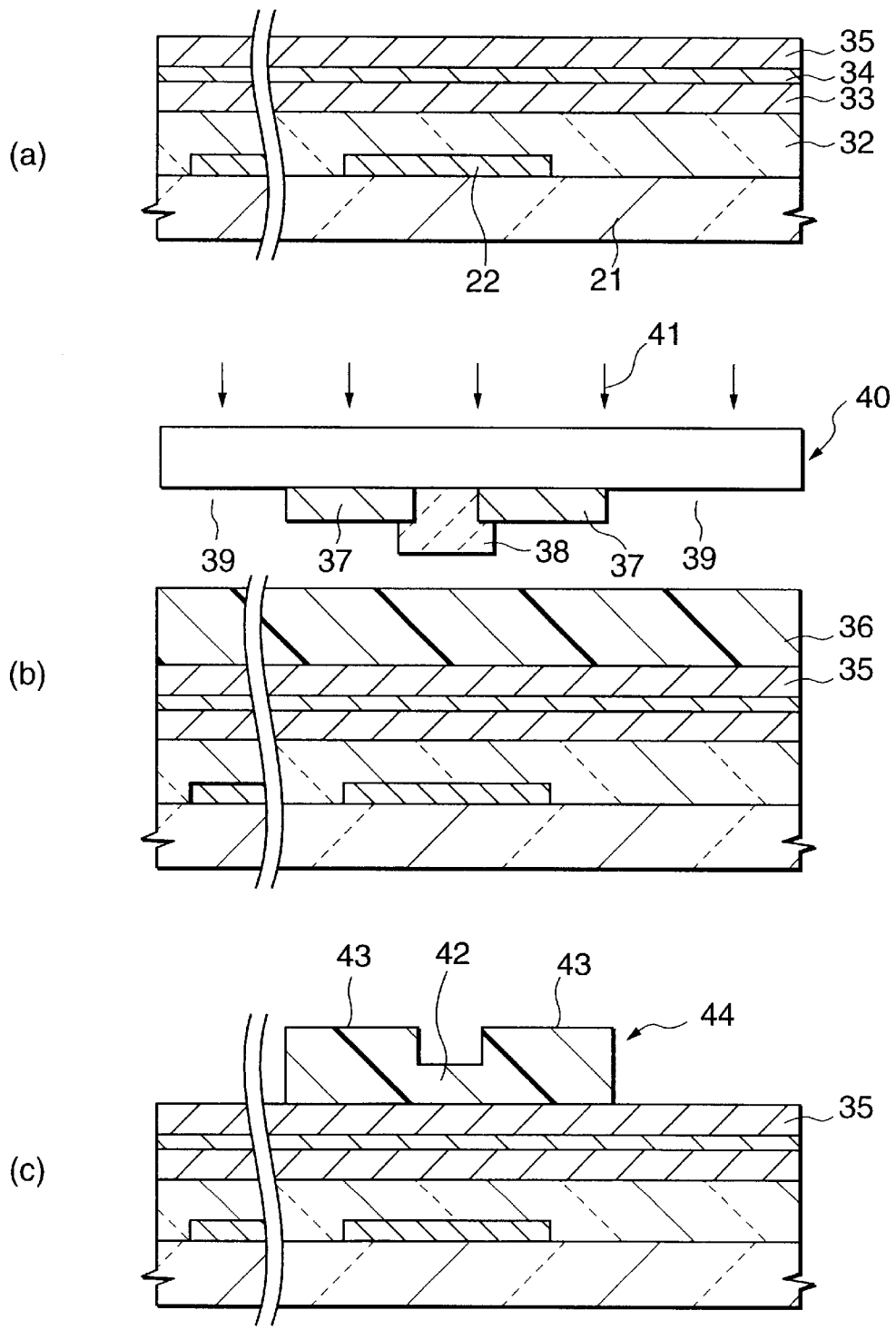
FIGS. 5(a) to 5(c) are cross sectional views of a manufacturing process in order of a TFT for explaining the second embodiment of the present invention.
Figure 6:
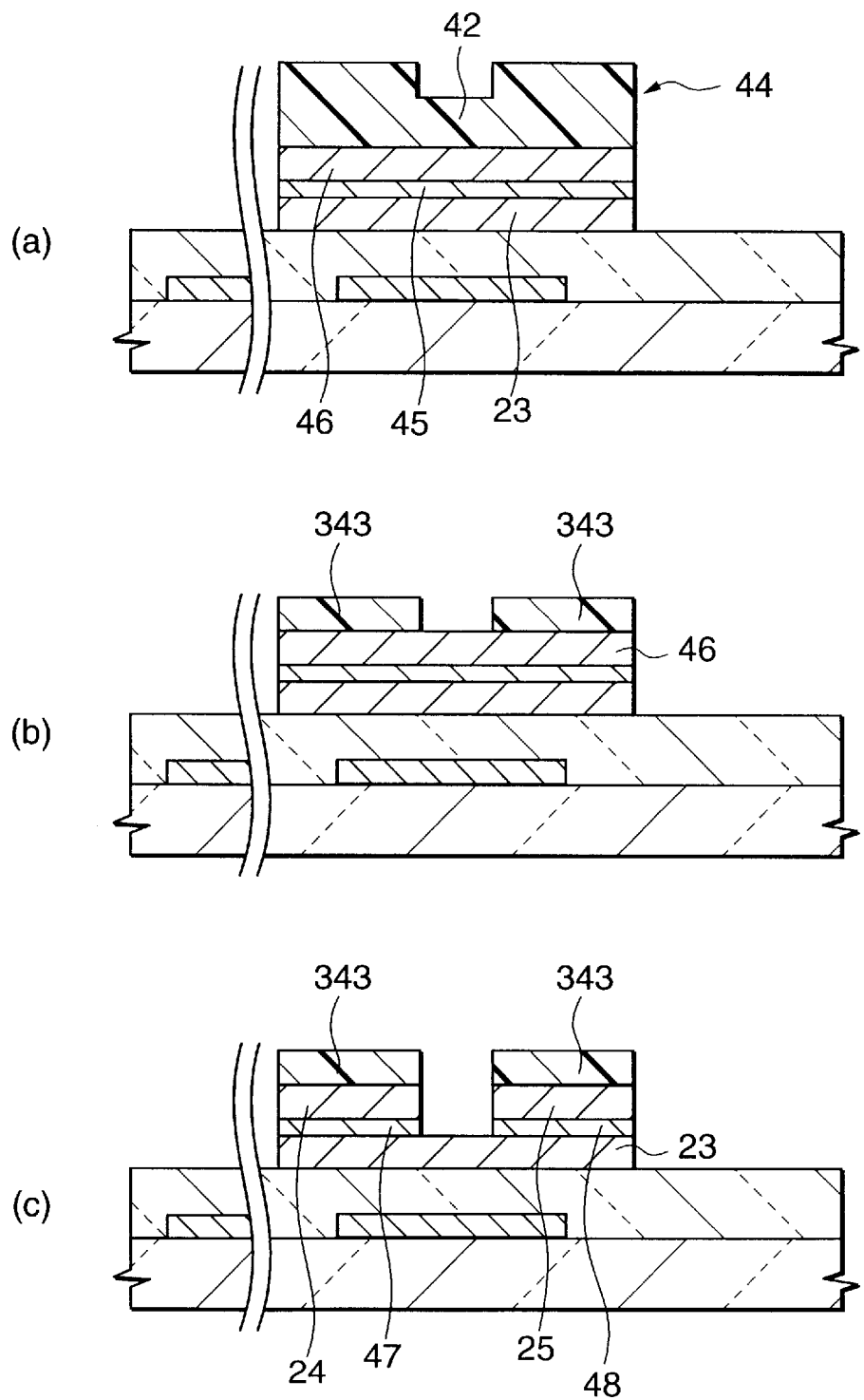
FIGS. 6(a) to 6(c) are cross sectional views of a manufacturing process in order of the TFT for explaining continuation of the above process.
Figure 7:
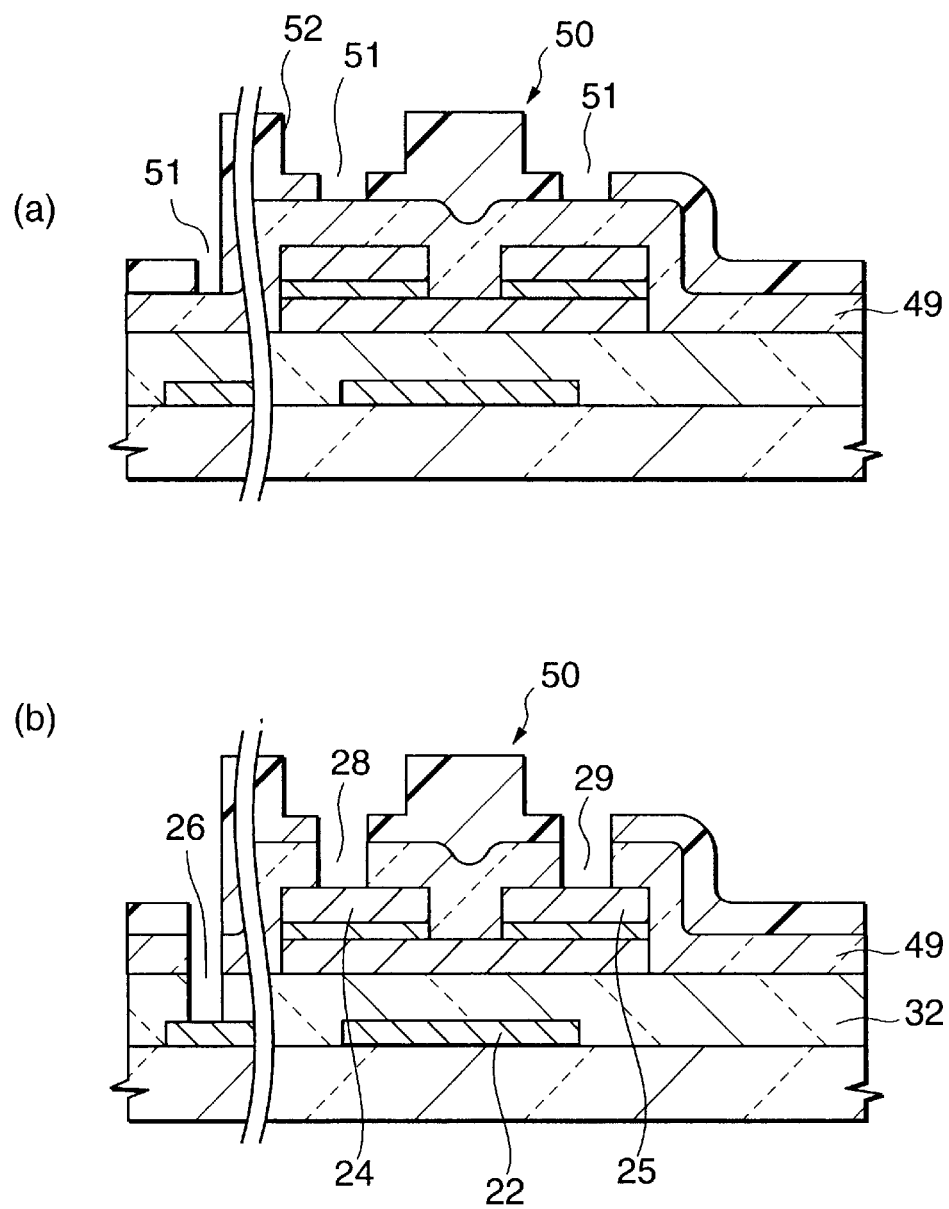
FIGS. 7(a) and 7(b) are cross sectional views of a manufacturing process in order of a TFT for explaining continuation of the above process.
Figure 8:
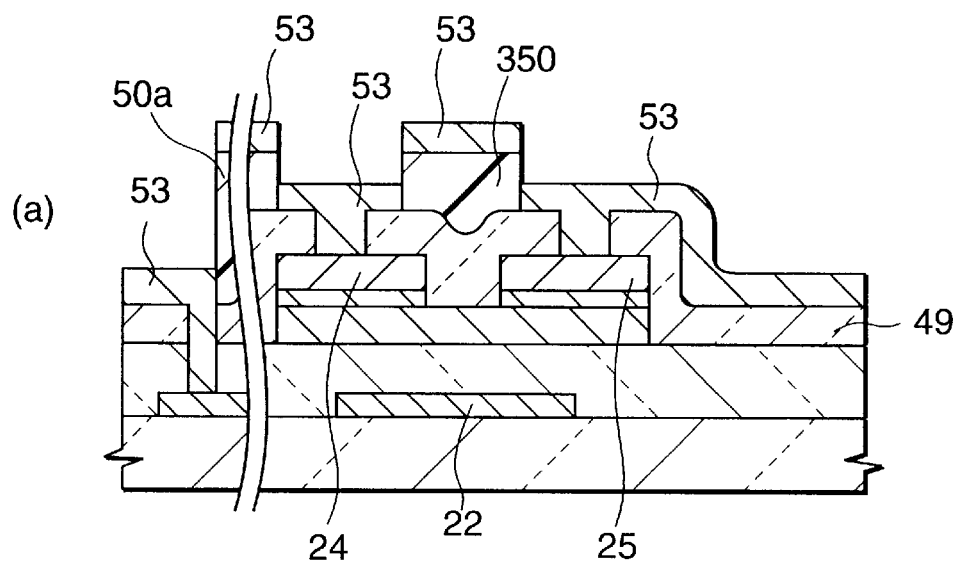
FIGS. 8(a) and 8(b) are cross sectional views of a manufacturing process in order of the TFT for explaining continuation of the above process.
Figure 8:
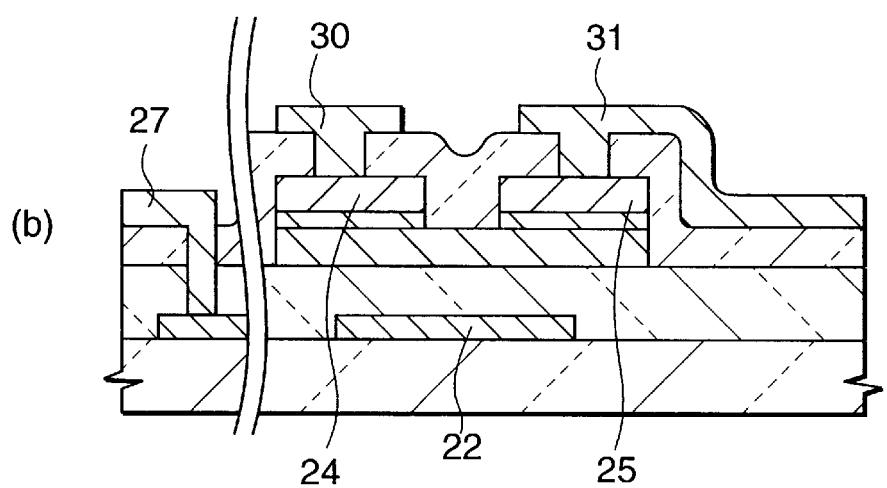

Next, a method of manufacturing a TFT, in which a manufacturing process of a liquid crystal display device can be greatly reduced, will be described. As a second embodiment of the present invention, a method of manufacturing a TFT and a liquid crystal display device by three photolitho processes will be described based on FIGS. 4 to 8(b). Here, FIG. 4 is a schematic plan view of a pixel portion of an active matrix substrate for the above liquid crystal display device. In FIG. 4, the shaded portions exist to easily see the drawing. In addition, FIGS. 5(a) to 8(b) are cross sectional views of a manufacturing process in order of the inverted staggered type TFT composing the pixel portion or a protection circuit portion of the active matrix substrate.

As shown in FIG. 4 with broken lines, a gate electrode 22 of the TFT as a switch transistor is formed on a glass substrate 21. Then, a semiconductor layer 23 as a region represented with slanted lines from upper right to lower left in the drawing is formed. Furthermore, a drain electrode 24 and a source electrode 25 as areas represented with slanted lines from upper left to lower right in the drawing are formed. Here, the drain electrode 24 composes a data wiring of the active matrix substrate.

The above gate electrode 22 is connected with a gate terminal electrode 27 through a contact hole 26. Similarly, the drain electrode 24 is connected with a transparent electrode wiring 30 through a contact hole 28. Furthermore, the source electrode 25 is connected with a transparent pixel electrode 31 through a contact hole 29. Although not shown, liquid crystal is to be formed on this transparent pixel electrode 31. Here, the gate terminal electrode 27, the transparent electrode wiring 30, and the transparent pixel electrode 31 are made of ITO as a transparent conductor.

Next, a method of manufacturing the above inverted staggered type TFT will be described. As shown in FIG. 5(a), a chromium (Cr) conductive film is patterned on the glass substrate 21 to form the gate electrode 22. Here, the film thickness of the gate electrode 22 is about 200 nm. Then, a gate insulation layer 32 is formed on the gate electrode 22. Here, the gate insulation layer 32 is made of a silicon nitride film with a film thickness of 500 nm.

Next, an amorphous silicon film 33 as a semiconductor thin film, having a film thickness of about 300 nm, an $n^+$ type amorphous silicon film 34 as a semiconductor thin film for an ohmic contact, having a film thickness of about 50 nm, and a metal conductive film 35 as a conductive film for a source and a drain, made of chromium or the like, are deposited to be laminated.

Next, in a photolitho process, as shown in FIG. 5(b), a resist film 36 is formed on the surface of the above metal conductive film 35. Here, the resist film 36 is a positive type resist, and its film thickness is 2.0 μm. Then, using a photomask 40 having a light shielding portion 37, a light half-transmitting portion 38, and a light transmitting portion 39, as a mask, as shown in FIG. 5(b), the above resist film 36 is exposed with exposure irradiation light 41. After this exposure, the above resist film 36 is developed by a general method.

An example of such a photomask having the light shielding portion, the light half-transmitting portion, and the light transmitting portion will be described. In the example shown in FIG. 5(b), the light shielding portion 37 is formed using, for example, chromium metal with a predetermined pattern on the photomask 40. Furthermore, the light half-transmitting portion 38 is formed using a halftone material. Here, the halftone material is, for example, tungsten siliside. Thus, the light half-transmitting portion is formed. Note that the light transmitting portion 39 is a region in which the above chromium metal and the halftone material are not present.

In addition, as an another example of the photomask having the light shielding portion, the light half-transmitting portion, and the light transmitting portion, the light shielding portion is formed using, for example, chromium metal with a predetermined pattern on a photomask substrate. Furthermore, the light half-transmitting portion is formed using a thin film of the above chromium metal. In this case, it is set such that the exposure irradiation light is transmitted by about a half in a region in which a thin film portion of the above chromium metal is formed. Thus, the light half-transmitting portion is formed.

Therefore, as shown in FIG. 5(c), a resist mask 44 composed of a first portion 42 in which a film thickness is thin and a second portion 43 in which a film thickness is thicker than the first portion, is formed in a predetermined region on the metal conductive film 35. Here, a transfer pattern of the light shielding portion 37 of the above photomask 40 becomes a second portion 43 of the above resist mask 44, and a transfer pattern of the light half-transmitting portion 38 is a first portion 42 of the resist mask 44.

Next, as shown in FIG. 6(a), using the above resist mask 44 as an etching mask, the metal conductive film 35, the $n^+$-type amorphous silicon film 34, and the amorphous silicon film 33 are etched in succession. Thus, as shown in FIG. 6(a), the semiconductor layer 23 as an island shape amorphous silicon layer, an island shaped $n^+$-type amorphous silicon layer 45, and a metal conductive layer 46 are formed.

Here, etching of the metal conductive film 35 is made by a wet etching using a chemical agent solution in which cerium ammonium nitrate and perchloric acid are mixed with each other, as an etchant. In addition, the $n^+$-type amorphous silicon film 34 and the amorphous silicon film 33 are dry-etched by an RIE using a mixture gas of $Cl_2$ and HBr, which is plasma-excited, as a reaction gas. In this dry etching process, the gate insulation layer 32 made of the silicon nitride film is hardly etched.

Next, a mixture gas of $O_2$ and $CF_4$ is plasma-excited to form active species such as these ions or radicals. Then, an etchback is made for the resist mask 44 by an anisotropic dry etching. In this dry etching, the first portion 42 of the resist mask 44 is removed with hardly producing a side etching in the resist mask 44. Thus, as shown in FIG. 6(b), a second portion 343 left on the metal conductive layer 46 is formed.

Next, as shown in FIG. 6(c), using the second portion 343 of the above resist mask as an etching mask, the metal conductive layer 46 and the $n^+$-type amorphous silicon layer 45 are etched in succession. Thus, the drain electrode 24 and the source electrode 25 are formed. Furthermore, ohmic layers 47 and 48 are formed.

Next, the above second portion 343 is removed, and then, as shown in FIG. 7(a), a passivation film 49 is formed on the entire surface. Here, the passivation film 49 is made of a silicon nitride film having a film thickness of about 500 nm.

Next, a resist mask 50 composed of a first portion as a region in which the film thickness is thin and a second portion as a region in which the film thickness is thicker than the first portion, is formed by a method similar to that described in FIGS. 2(a) to 2(d). Here, a first opening 51 is formed in the first portion, and a second opening 52 is formed in the second portion.

Next, using the resist mask 50 as an etching mask, the passivation film 49, or the passivation film 49 and the gate insulation layer 32 is/are dry-etched by an RIE. Here, a reaction gas is a mixture gas of $SF_6$ and He, which is plasma-excited. Thus, as shown in FIG. 7(b), the contact holes 26, 28, and 29 are formed on the gate electrode 22, the drain electrode 24, and the source electrode 25 respectively.

Next, as described in FIGS. 2(a) to 2(d), a mixture gas of $O_2$ and $CF_4$ is plasma-excited, and then an etchback is made for the above resist mask 50. By this etchback, the first portion of the resist mask 50 is removed. In this dry etching, as shown in FIG. 8(a), a resist mask 350 having an inverse taper shaped opening is left. For the connection with the gate electrode 22, the drain electrode 24, and the source electrode 25, a transparent electrode film 53 having a film thickness of about 0.8 μm is deposited on the entire surface by a progressive sputtering method. Then, the resist mask 350 is removed by a general liftoff technique.

Therefore, as described in FIGS. 2(a) to 2(d), as shown in FIG. 8(b), the gate terminal electrode 27 connected with the gate electrode 22 is formed, the transparent electrode wiring 30 connected with the drain electrode 24 is formed, and the transparent pixel electrode 31 connected with the source electrode 25 is formed. As a result, the TFT of a pixel portion is formed.

Although the TFT is manufactured by five photolitho processes in a conventional technique, according to the present invention, as is apparent from the above description, the TFT can be manufactured by three photolitho processes. Thus, a manufacturing process of a liquid crystal display device composed of the TFT is greatly reduced. In addition, a manufacturing yield of the liquid crystal display device is improved and thus the productivity is increased. Furthermore, a manufacturing cost of the liquid crystal display device is greatly reduced and the TFT having high reliability is easily manufactured.

Next, a third embodiment of the present invention will be described based on FIGS. 9(a) to 9(c) and FIGS. 10(a) and 10(b). In this embodiment, a method of manufacturing a TFT and a liquid crystal display device by two photolitho processes will be described. Here, FIGS. 9(a) to 9(c) and FIGS. 10(a) and 10(b) are cross sectional views of a main manufacturing process in order of, a reverse staggered type TFT composing the above active matrix substrate, that is, a TFT composing a pixel portion or a protection circuit portion.

First, a chromium conductive film is deposited for forming a gate electrode. Subsequently, a gate insulation layer, an amorphous silicon film, an n+-type amorphous silicon film, and a metal conductive film are deposited to be laminated in succession.

Figure 9:
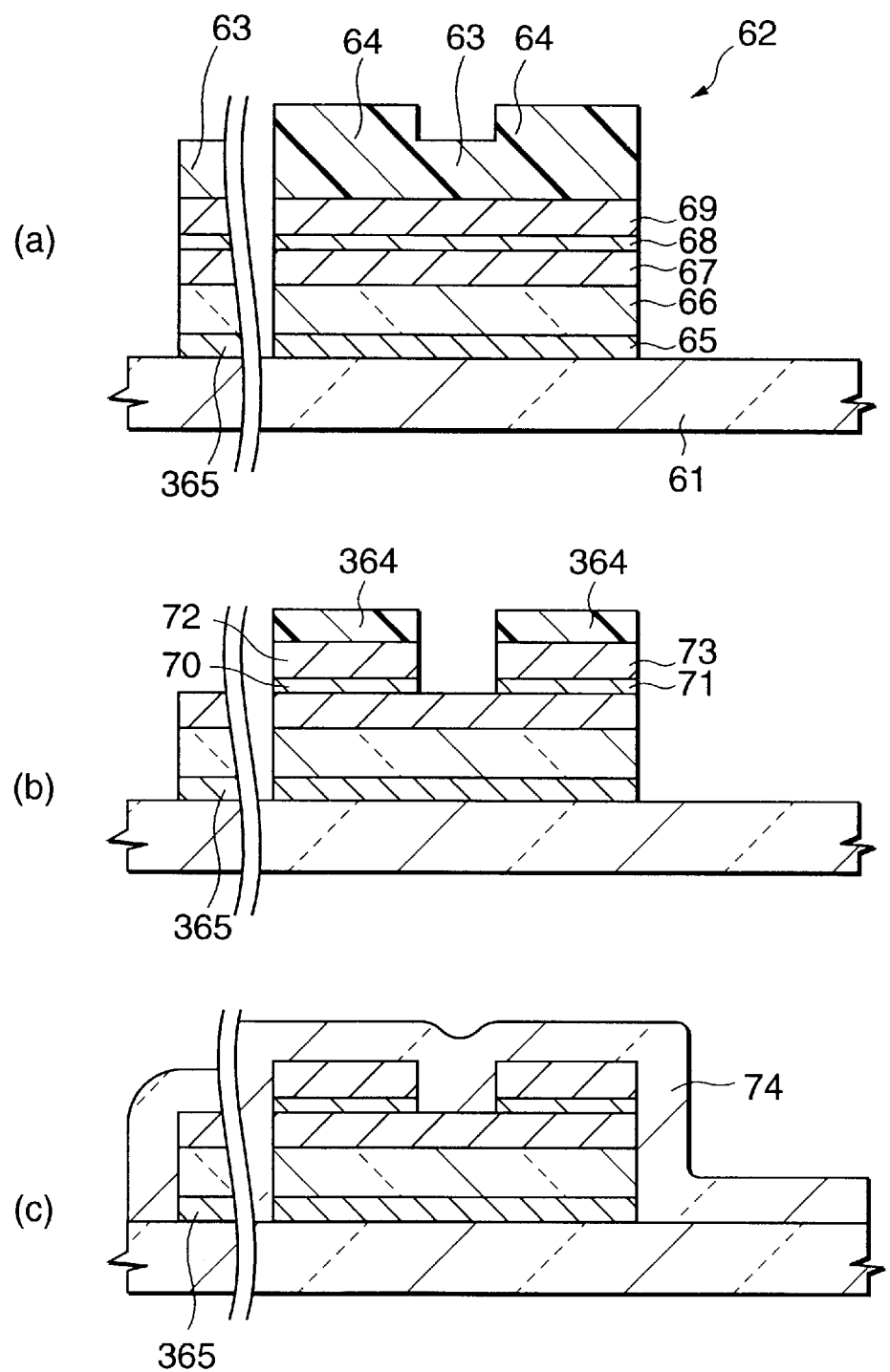
FIGS. 9(a) to 9(c) are cross sectional views of a manufacturing process in order of the TFT for explaining the third embodiment of the present invention.

Next, by a photolitho process, as shown in FIG. 9(a), a resist mask 62 is formed on the surface of the metal conductive film as an uppermost layer. Here, the resist mask 62 has a first portion 63 as a region in which the film thickness is thin and a second portion 64 as a region in which the film thickness is thicker than the first portion. Here, the film thickness of the first portion 63 is about 1.0 μm, and the film thickness of the second portion 64 is about 3.0 μm. Such a resist mask 62 is formed by the same method as that described in FIGS. 5(a) to 5(c) in the second embodiment.

Next, as shown in FIG. 9(a), using the above resist mask 62 as an etching mask, the above metal conductive film, the n+-type amorphous silicon film, the amorphous silicon film, the gate insulation layer, and the chromium conductive film are etched in succession. Thus, a gate electrode 65, a gate insulation layer 66, a semiconductor layer 67, an n+-type amorphous silicon layer 68, and a metal conductive layer 69 are formed. Here, etching of the metal conductive film and the chromium conductive film is performed by the same method as that described in the second embodiment. In addition, etching of the n+-type amorphous silicon film and the amorphous silicon film is made by dry etching using a mixture gas of $SF_6$, HCl, and He, which is plasma-excited. In addition, etching of the gate insulation layer is performed by dry etching using a mixture gas of $SF_6$ and He, which is plasma-excited.

Next, as described in FIGS. 6(a) to 6(c), a mixture gas of $O_2$ and $CF_4$ is plasma-excited, and then an etchback is made for the resist mask 62 by anisotropic dry etching. In this etchback process, the first portion 63 of the resist mask 62 is removed. Then, a second portion 364 left on the metal conductive layer 69 is formed.

Next, using the second portion 364 as an etching mask, the above metal conductive layer 69 and the n+-type amorphous silicon layer 68 are etched in succession. Thus, as shown in FIG. 9(b), ohmic layers 70 and 71, a drain electrode 72, and a source electrode 73 are formed.

Next, the second portion 364 is removed, and then, as shown in FIG. 9(c), a passivation film 74 is deposited on the entire surface.

Figure 10:
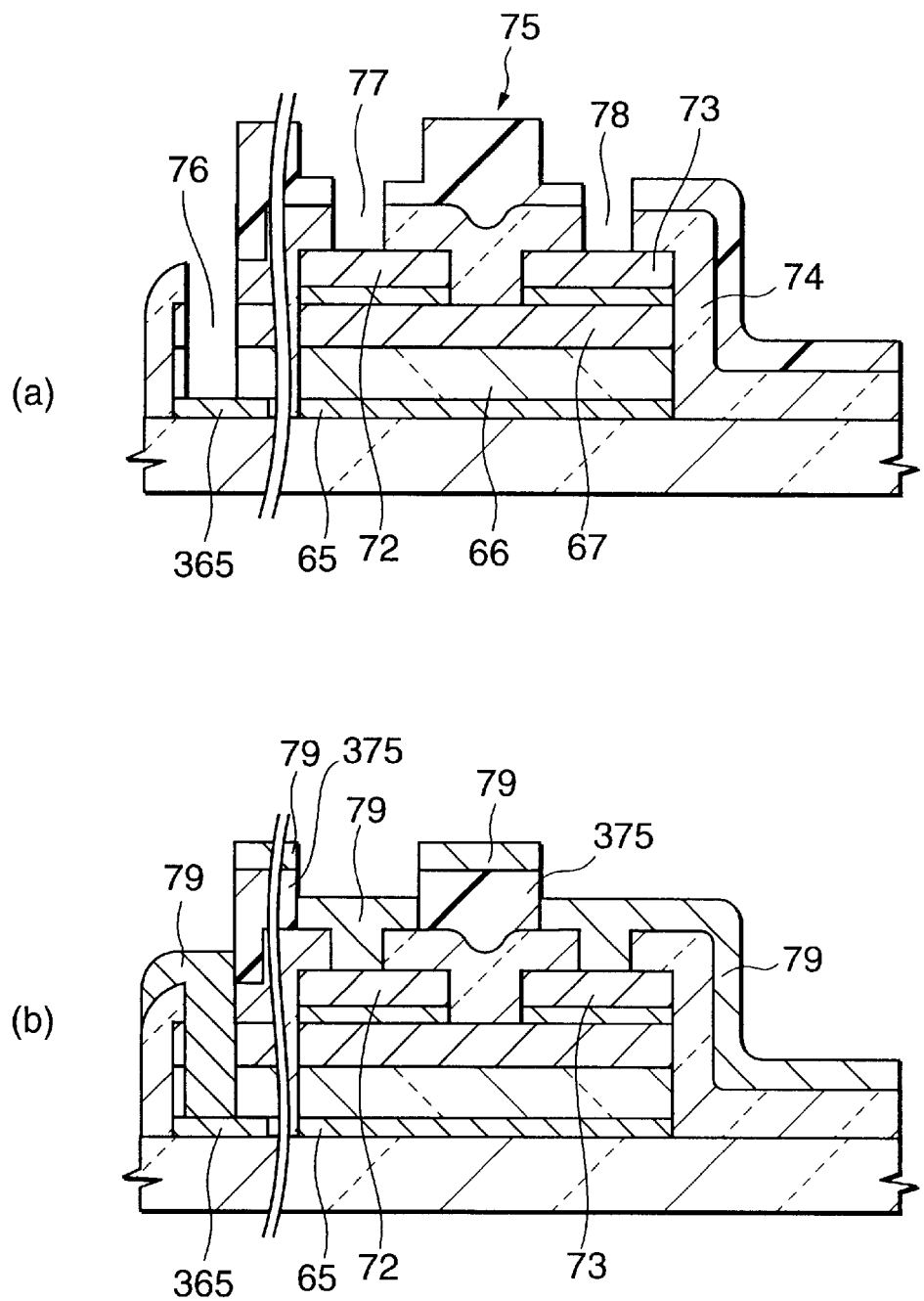
FIGS. 10(a) and 10(b) are cross sectional views of a manufacturing process in order of the TFT for explaining continuation of the above process.

Next, as described in FIGS. 7(a) and 7(b), a resist mask 75 composed of a first portion as a region in which the film thickness is thin and a second portion as a region in which the film thickness is thicker than the first portion is formed. Then, dry etching is performed using the resist mask 75 as an etching mask. In this etching process, as shown in FIG. 10(a), the passivation film 74, the semiconductor layer 67, and the gate insulation layer 66, which are located on the gate terminal portion 365, are dry-etched in succession to form a contact hole 76. Simultaneously, contact holes 77 and 78 are formed on the drain electrode 72 and the source electrode 73 respectively.

Hereinafter, as described in FIG. 8(a), as shown in FIG. 10(b), a resist mask 375 having an inverse taper shaped opening is formed. After a transparent electrode film 79 is deposited on the entire surface by a progressive sputtering method, the resist mask 375 is removed by a general liftoff technique. Thus, as described in FIG. 8(b), the wiring connected with the gate terminal portion 365, and the electrodes connected with the drain electrode 72 and the source electrode 73, are formed.

Next, a schematic plan view of a pixel portion of the above active matrix substrate for a liquid crystal display device, which is formed as described above will be described based on FIG. 11. Here, the shaded portions exist to easily see the drawing.

Figure 11:
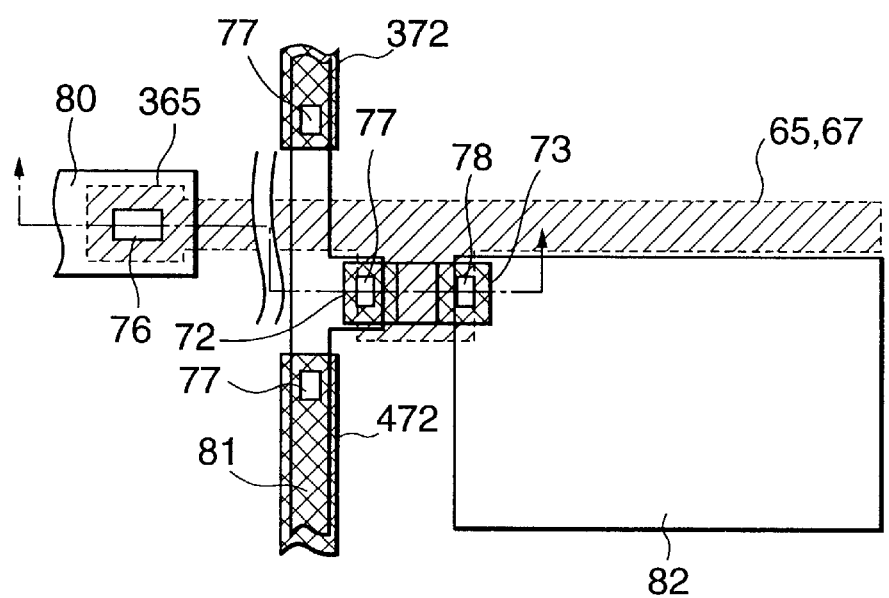
FIG. 11 is a plan view of a pixel portion of a liquid crystal display device for explaining the third embodiment of the present invention.

As shown in FIG. 11 with broken lines, a gate electrode 65 (including a gate terminal portion 365) of the TFT as a switch transistor is formed. Then, the semiconductor layer 67 as a region represented with slanted lines from upper right to lower left in the drawing is formed. Here, the gate electrode 65 (including a gate terminal portion 365) and the semiconductor layer 67 become the same pattern. Furthermore, the drain electrode 72 and the source electrode 73 as areas represented with slanted lines from upper left to lower right in the drawing are formed. Here, the drain electrode 72 is divided into three regions, drain electodes 72, 372, 472, as shown in FIG. 11. The contact holes 77 are formed corresponding to the respective drain electodes. The reason why the contact holes are formed on each drain electrode 72, 372, 472 is that the same pattern of the gate electrode and the semiconductor layer as the drain electrode is formed electrically isolated from each other and each drain electrode has to be finally connected to each other by later-described transparent electrode wiring 81.

The above gate electrode 65 is connected with a gate terminal electrode 80 through the contact hole 76. Similarly, the drain electrodes 72, 372, 472 are connected with a transparent electrode wiring 81 through the contact hole 77. Furthermore, the source electrode 73 is connected with a transparent pixel electrode 82 through the contact hole 78.

An effect of the third embodiment becomes further remarkable than that described in the second embodiment.

Next, a fourth embodiment of the present invention will be described based on FIGS. 12(a) to 12(d) and FIGS. 13(a) and 13(b). A plane view in the fourth embodiment is same as FIG. 4 in the second embodiment. Also, a cross sectional view in the fourth embodiment is the one taken along with the same cutting line as that in FIG. 4. In this embodiment, a characteristic of a pattern formation of the present invention will be further described. Note that, in this case, a TFT is formed by four photolitho processes.

Figure 12:
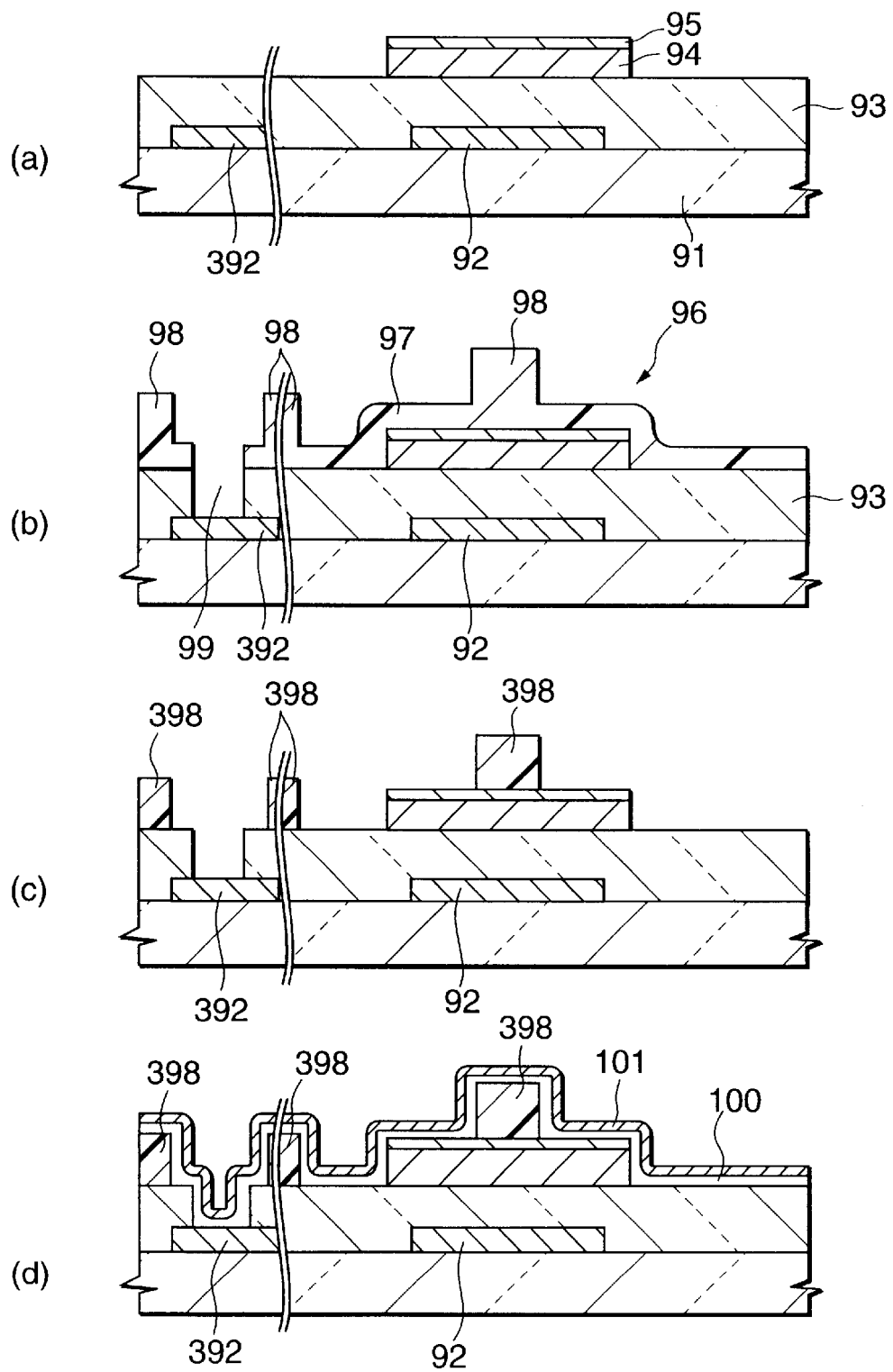
FIGS. 12(a) to 12(d) are cross sectional views of a manufacturing process in order of a TFT for explaining a fourth embodiment of the present invention.

First, as shown in FIG. 12(a), a chromium conductive film is patterned to form a gate electrode 92 including a gate terminal portion 392 on a glass substrate 91. After a gate insulation layer 93 is deposited on the glass substrate 91, a semiconductor layer 94 and an $n^+$-type amorphous silicon layer 95 are formed.

Next, as described in the second embodiment or the third embodiment, as shown in FIG. 12(b), a resist mask 96 is formed by a photolitho process. Here, the resist mask 96 has a first portion 97 as a region in which the film thickness is thin and a second portion 98 as a region in which the film thickness is thicker than the first portion 97. Then, a contact hole 99 is formed in the gate insulation layer 93 on the gate terminal portion 392.

Next, a mixture gas of $O_2$ and $CF_4$ is plasma-excited, and thus an etchback is made for the resist mask 96 by an anisotropic dry etching. In this etchback process, the first portion 97 of the resist mask 96 is removed. Then, as shown in FIG. 12(c), a second portion 398 left is formed.

Figure 13:
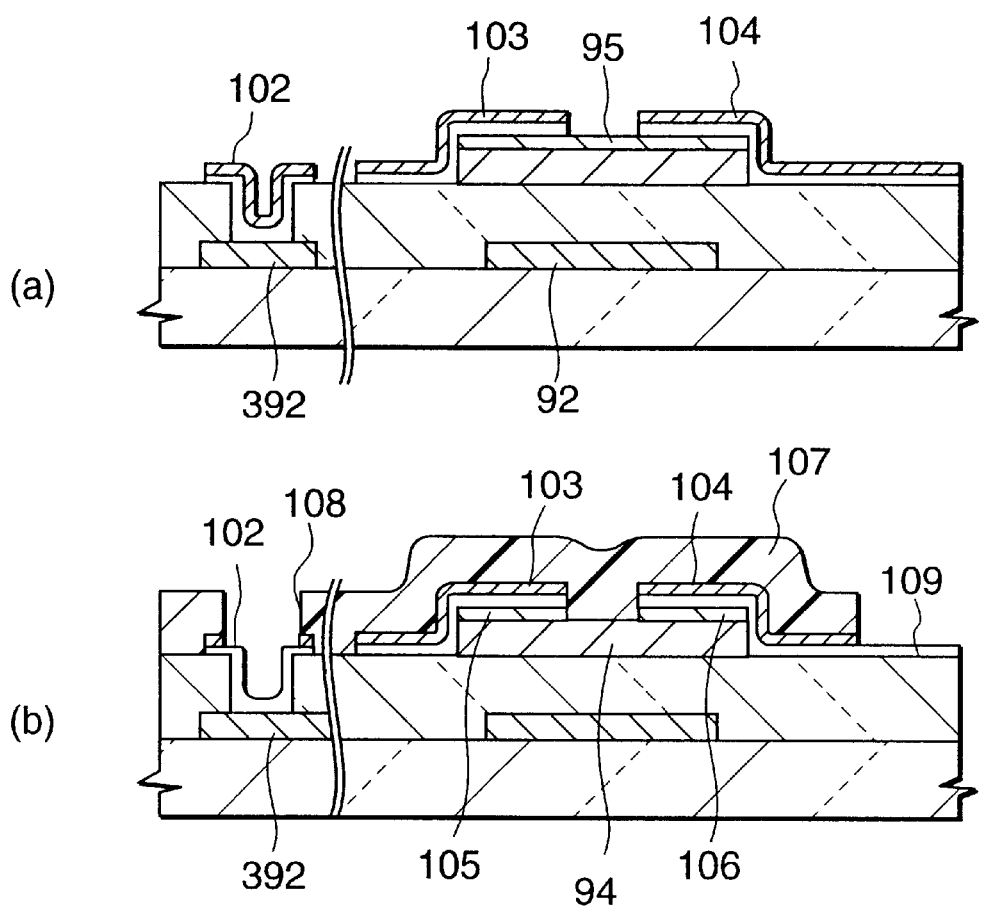
FIGS. 13(a) and 13(b) are cross sectional views of a manufacturing process in order of the TFT for explaining continuation of the above process.

Next, as shown in FIG. 12(d), a transparent electrode film 100 and a metal conductive film 101 are formed to be laminated. Here, the transparent electrode film 100 is an ITO film and the metal conductive film 101 is a chromium film. Then, the above second portion 398 is removed. That is, as shown in FIG. 13(a), a gate terminal electrode 102 connected with the gate terminal portion 392, and a drain electrode 103 and a source electrode 104 connected with the $n^+$-type amorphous silicon layer 95, are formed by a liftoff. Here, the gate terminal electrode 102, the drain electrode 103, and the source electrode 104 each are composed of the above two-layer conductor film.

Next, using the drain electrode 103 and the source electrode 104 as etching masks, the $n^+$-type amorphous silicon layer 95 is etched. Thus, as shown in FIG. 13(b), ohmic layers 105 and 106 connected with the drain electrode 103 and the source electrode 104, respectively, are formed in end portions of the semiconductor layer 94.

Thereafter, a passivation film 107 is deposited on the entire surface, and then an opening portion 108 is formed on the gate terminal electrode 102 by etching the passivation film 107 and the metal conductive film 101 using a passivation pattern resist mask (not shown). Furthermore, the metal conductive film 101 located in a region of the source electrode 104 is removed by using the passivation pattern resist mask (not shown) to form a transparent pixel electrode 109. Here, if the transparent pixel electrode is formed using not a transparent metal film but a light shielding metal film, it becomes a reflection electrode in a reflection type liquid crystal display device.

In the resent invention, in manufacturing the liquid crystal display device, a material film composing a semiconductor element such as a TFT is deposited in advance as a lamination film of multilayer. As an etching mask for patterning the above lamination film, a resist mask patterned to have a plurality of thicknesses is formed.

There are many variations as a method of forming such a resist mask. Hereinafter, this will be described.

The second embodiment relates to the case where a positive type resist is applied and then a pattern transfer is made by a one-time exposure method. In the second embodiment, a single layer resist film is used. However, a two-layer resist film can be used instead of a single-layer resist film. When the two-layer resist film is used, an exposure sensitivity of a lower layer resist film may be set to be lower than that of an upper layer resist film. Then, by selectively exposing the upper layer resist film and then developing the two-layer resist film, a following structure is obtained that the above first portion is composed of the lower layer resist film and the second portion is composed of the lower layer resist film and the upper layer resist film. Thus, the precision of the transfer pattern is greatly improved.

Also, in the case of the above one-time exposure method, a negative type resist of a single layer may be used as a resist film. Since the exposure sensitivity of the negative type resist is generally lower than that of the positive type resist, the exposure method can be easily applied using the single layer negative resist film to form a resist mask having different thicknesses. Alternatively, a negative type two-layer resist film may be used. However, when this negative type resist film is used, a photomask becomes a reversed pattern of the photomask 40 in the second embodiment. In this case, the light shielding portion 37 of the photomask 40 has to be changed into a light transmitting portion and the light transmitting portion 39 has to be changed into a light shielding portion. The light half-transmitting portion 38 is not changed.

Also, according to the present invention, a sequential exposure may be applied using a plurality of photomasks for a pattern transfer. That is, when a plurality of exposure through different photomasks are performed on the single layer resist film and it is developed, the above resist mask can be formed. Also in this case, a resist film of a positive type or a negative type, or a two-layer resist film of a positive type or a negative type may be used.

In the above embodiments, the case where the gate electrode or the source electrode and the drain electrode are formed using chromium has been described. It is mentioned that Ti, Mo, W or these alloys can be used as a material of the metal conductive film for forming the source electrode and the drain electrode or a material of the gate electrode.

Also, in the above-stated embodiments, the case where the inverted staggered type TFT is formed on the insulating substrate has been described. It is mentioned that the present invention can be applied to the case where a non-reversed staggered type TFT is formed.

According to the above-stated embodiments, in the resist mask patterned to have a plurality of thicknesses, the region in which the film thickness is thin is given as the first portion and the region in which the film thickness is thick is given as the second portion. Here, when sililation is selectively made for the surface of the second portion, a liftoff of a metal on the second portion left after etching of the first portion becomes easier. That is, in a process for removing the first portion by etching, even when the first portion is thick, a film decrease of the second portion is suppressed by the sililation of the second portion. A technique for applying this sililation is disclosed by the present inventor(s) in detail in Japanese Patent Application Laid-open No. Hei 11-307780.

Note that the present invention is not limited to the above-stated embodiments, and various changes and modifications of the embodiments may be appropriately made in the scope not departing from the gist of the present invention.

According to a main portion of the present invention described above, after the laminated films composing the TFT are patterned and covered by a passivation film on the insulating substrate, the resist mask having the plurality of regions with different film thicknesses is formed by patterning on the passivation film. Then, the conductor film is patterned by the liftoff method using this resist mask. Alternatively, using other resist mask having a plurality of regions with different film thicknesses as an etching mask, laminated material films are processed two times each for their different portions by utilizing the film thickness difference of the resist mask to form a predetermined pattern of the laminated films.

By the above new pattern forming method and the processing method, the liquid crystal display device, which has been manufactured by five photolitho processes in the conventional art can be manufactured by two or three photolitho processes.

Thus, by the reduction of the process, the manufacturing yield of the liquid crystal display device is improved to increase the productivity and then the manufacturing cost of the liquid crystal display device is greatly reduced. Furthermore, the reliability is greatly improved.

What is claimed is:

1. A pattern forming method comprising the steps of:
   forming a first layer on a substrate;
   forming a second layer on the first layer;
   forming a mask layer on the second layer, the mask layer being patterned to have a first region and a second region such that the second region is thicker than the first region and the first region is provided with an opening;
   etching the second layer using the mask layer as an etching mask to form a contact hole reaching a surface of the first layer;
   removing at least the first region by etching to leave a liftoff pattern constituting a third region within the second region on the first layer;
   forming a third layer for covering the third region; and
   removing the third region to pattern the third layer by liftoff after forming the third layer.

2. A pattern forming method according to claim 1, wherein the second layer is made of the insulation layer and a material film for liftoff in order from a lower layer, and the liftoff pattern is made of the material film for liftoff.

3. A pattern forming method according to claim 1, wherein the step of removing the first region by etching is performed by dry etching using active species obtained by plasma-exciting a halogen compound gas and an oxygen gas.

4. A pattern forming method according to claim 1, wherein the etching of the second layer is dry etching, a surface of the second region is altered by the dry etching, and a cross sectional shape of the third region is formed into an inverse taper shape by the dry etching of the first region.

5. A pattern forming method according to claim 1, wherein a light shielding portion, a light half-transmitting portion, and a light transmitting portion are formed in a mask pattern of a photomask used in a photolithography process, and after the light shielding portion pattern, the light half-transmitting portion pattern, and the light transmitting portion pattern are transferred into a resist film (photosensitive organic film) by one time exposure, the mask layer is formed by a development.

6. A pattern forming method according to claim 5, wherein the resist film is composed of a resist film having two layers with different exposure sensitivities.

7. A pattern forming method according to claim 1, wherein in an exposure of a photolithography process, after sequential exposures are performed for a resist film using a plural kinds of photomasks with different mask patterns, the mask layer is formed by a development.

8. A pattern forming method according to claim 7, wherein the resist film is composed of a resist film having two layers with different exposure sensitivities.

9. A method of manufacturing a thin film transistor, comprising the steps of:
   patterning a first conductive film deposited on an insulating substrate to form a first conductive film pattern;
   depositing a first insulation layer covering the first conductive film, then depositing a second conductive film thereon, and forming a first mask on the second conductive film, the first mask having a plurality of regions with different film thicknesses and including a region as a first portion which is thin in a film thickness, and a region as a second portion which is thicker than the first portion in the film thickness;
   etching the second conductive film using the first mask as an etching mask, removing the first portion of the first mask to leave the second portion as a third portion, and subsequently etching the second conductive film using the third portion as a mask to process the second conductive film;
   after removing the third portion of the first mask, depositing a second insulation layer covering the second conductive film over the first insulation layer;
   forming a second mask on the second insulation layer, the second mask having a plurality of regions with different film thicknesses and including a region as a first portion which is thin in the film thickness, a region as a second portion which is thicker than the first portion in the film thickness, and an opening formed in the first portion;
   etching the second insulation layer and the first insulation layer using the second mask as an etching mask to partially form a first contact in the second insulation layer and the first insulation layer on the first conductive film and to partially form a second contact in the second insulation layer on the second conductive film; and
   removing the first portion of the second mask to make a remainder portion of the second portion a third portion, subsequently depositing a third conductive film on the second insulation layer, and removing the third portion together with the third conductive film deposited thereon to form an electrode or a wiring for a third conductive film.

10. A method of manufacturing a thin film transistor according to claim 9, wherein the first conductive film is a conductive film for a gate electrode, the first insulation layer is a gate insulation layer, the second conductive film is a lamination film in which a semiconductor thin film, a semiconductor thin film for an ohmic contact, and a conductive film for a source and a drain are deposited in succession, the second insulation layer is a passivation film, and the third conductive film is a metal film for source and drain lead wirings.

11. A method of manufacturing a thin film transistor according to claim 10, wherein the first portion of the first mask and the first portion of the second mask are removed by dry etching using active species obtained by plasma-exciting a halogen compound gas and an oxygen gas, and the semiconductor thin film for an ohmic contact is removed by etching using the third portion of the first mask and the third conductive film is patterned by removing third portion of the second mask as liftoff masks.

* * * * *